United States Patent
Pannek et al.

(10) Patent No.: US 8,245,571 B2
(45) Date of Patent: Aug. 21, 2012

(54) COMPONENT AND PRODUCTION METHOD FOR A COMPONENT

(75) Inventors: Thorsten Pannek, Stuttgart (DE);
Udo-Martin Gomez, Leonberg (DE);
Horst Muenzel, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 373 days.

(21) Appl. No.: 12/611,634

(22) Filed: Nov. 3, 2009

(65) Prior Publication Data

US 2010/0116043 A1    May 13, 2010

(30) Foreign Application Priority Data

Nov. 10, 2008  (DE) .......... 10 2008 043 598

(51) Int. Cl.
*B60C 23/02* (2006.01)
*B60C 23/00* (2006.01)
*H03B 5/04* (2006.01)

(52) U.S. Cl. .......... 73/146.5; 331/66; 340/447
(58) Field of Classification Search .......... 73/146–146.5
See application file for complete search history.

(56) References Cited

U.S. PATENT DOCUMENTS

| | | | |
|---|---|---|---|
| 6,995,622 B2 | 2/2006 | Partridge et al. | |
| 7,453,804 B1 * | 11/2008 | Feroz et al. | 370/230 |
| 2005/0179530 A1 | 8/2005 | Stewart et al. | |
| 2009/0295406 A1 * | 12/2009 | Schoen et al. | 324/633 |

* cited by examiner

*Primary Examiner* — Andre Allen
(74) *Attorney, Agent, or Firm* — Kenyon & Kenyon LLP

(57) ABSTRACT

A component having an acceleration sensor having at least one freely oscillatory mass, and a resonator having at least one resonating structure, in which the at least one freely oscillatory mass of the acceleration sensor and the at least one resonating structure of the resonator are disposed on and/or in one chip. A corresponding production method for a component is also described.

10 Claims, 5 Drawing Sheets

COMPONENT AND PRODUCTION METHOD FOR A COMPONENT

RELATED APPLICATION INFORMATION

The present application claims priority to and the benefit of German patent application no. 10 2008 043 598.8, which was filed in Germany on Nov. 10, 2008, the disclosure of which is incorporated herein by reference.

FIELD OF THE INVENTION

The present invention relates to a component and to a production method for a corresponding component.

BACKGROUND INFORMATION

A conventional tire pressure sensor of a tire pressure monitoring system (TPMS) often has a data transfer device and/or a motion sensor for detecting movement of the tire pressure sensor in addition to having a pressure sensor device configured to ascertain information in respect of a pressure in an external volume of the tire pressure sensor.

A data transfer device of a conventional tire pressure sensor is often configured to transmit radio signals in an ISM band (Industrial Scientific and Medical Band), for example at a frequency of 315 MHz or 433 MHz, to an evaluating device outside of the tire. An ultra-high frequency (UHF) of that kind is generally generated using a phase-locked loop (PLL), which may also be referred to as a phase-coupled closed-loop control circuit. The phase-locked loop generates and stabilizes the emitted ultra-high frequency by using a phase comparison between a fixed, very precise reference frequency and a frequency of a voltage-controlled oscillator (VCO). The reference frequency may be provided by a quartz crystal oscillator (having a resonant frequency of 13.56 MHz) or by a MEMS resonator having a silicon structure which is caused to resonate. A MEMS resonator, which will be referred to hereinafter as a silicon resonator, is discussed, for example, in U.S. Pat. No. 6,995,622 B2.

To save energy when using a conventional tire pressure sensor, the frequency with which measurement and transmission is carried out by the tire pressure sensor is often dependent on the driving condition of the vehicle fitted with the tire pressure sensor. In that case, when rotation of a wheel fitted with the tire pressure sensor is detected by a motion sensor (i.e. when the associated vehicle is travelling), an internal pressure of the wheel will be measured and transmitted via the data transfer device to the evaluating device outside of the tire with a greater frequency than when the wheel is stationary. Examples of a motion sensor are discussed in US 2005/016722 A1 and in US 2005/0179530 A1. The motion sensor may, for example, be a ball switch and/or an acceleration sensor. The acceleration sensor may be formed using silicon and/or ceramic technology.

It should be possible for a tire pressure sensor having a suitable data transfer device and a reliable motion sensor to be produced inexpensively and in a simple manner. In addition, for installation of such a tire pressure sensor, it is advantageous for the tire pressure sensor to be of a comparatively small size notwithstanding the data transfer device and the motion sensor.

SUMMARY OF THE INVENTION

The exemplary embodiments and/or exemplary methods of the present invention provides a component having the features described herein, and a production method for a component having the features further described herein.

The exemplary embodiments and/or exemplary methods of the present invention is based on the realization that the size of a component having an acceleration sensor and a resonator may be reduced if at least the at least one freely oscillatory mass of the acceleration sensor and the at least one resonating structure of the resonator are formed on one chip. The one chip may be a compact chip. A compact chip is to be understood as being a chip that does not have a subdivision into two separate compact chip units. To divide the compact chip, therefore, a pressure required for breaking/sawing/milling of the chip has to be applied.

In addition, further elements of the acceleration sensor and/or of the resonator may be disposed on and/or in the one chip. The resonator integrated in the chip is in that case configured to provide at an output a signal having a predefined frequency. Correspondingly, the acceleration sensor integrated in the chip is configured to provide at its output information in respect of an acceleration of the component in at least one predefined direction in space. The information is, for example, a capacitance signal, a capacitance-change signal and/or a voltage signal, the value of which corresponds to the acceleration of the component. The component may be a micromechanical component. Correspondingly, the production method according to the present invention may be used to produce a micromechanical component.

Since a chip with the acceleration sensor and the resonator frequently requires only half the space occupied by a first chip with an acceleration sensor and a second chip with a resonator, the space required for the acceleration sensor and the resonator may thus be reduced in a simple manner. Furthermore, installation of the one chip with the integrated acceleration sensor and the integrated resonator in the interior of the component requires less work than installing the first chip with the acceleration sensor and the additional, second chip with the resonator. Accordingly, the number of work steps required when fabricating the component may be reduced.

The exemplary embodiments and/or exemplary methods of the present invention therefore makes possible a component having an acceleration sensor and a resonator in a comparatively small size and at little cost. The small structural shape of the component additionally prevents damage to the component during mounting, since owing to its small size/mass the component is easier to mount. In addition, less wheel imbalance is caused on mounting of the component. The small size/mass of the component also facilitates integration of the component in and/or on a tire.

Conventionally, an acceleration sensor formed on a first chip and a resonator disposed on a second chip occupy a relatively large volume in a component. That problem may be solved, however, by the exemplary embodiments and/or exemplary methods of the present invention. In addition, the production method according to the present invention may be performed comparatively easily and using standard steps.

In one advantageous embodiment of the component, the at least one freely oscillatory mass of the acceleration sensor and/or the at least one resonating structure of the resonator are formed from a semiconductor material. That makes it easier for the at least one freely oscillatory mass and the at least one resonating structure to be integrated into the same chip.

For example, the at least one freely oscillatory mass of the acceleration sensor may project at least partially into a first internal volume having a first internal pressure, and the at least one resonating structure of the resonator may project at least partially into a second internal volume having a second internal pressure which is different from the first internal pressure. The different internal pressures ensure that the resonant frequencies and/or the Q-factors of the resonator and the acceleration sensor differ from each other.

In one advantageous embodiment, the component includes a phase-locked loop (PLL) with a voltage-controlled oscillator (VCO), which is coupled to the resonator in such a manner that a reference signal having a reference frequency provided by the resonator may be provided to the phase-locked loop. The phase-locked loop with a voltage-controlled oscillator may form part of a separate ASIC (Application Specific Integrated Circuit). That ASIC may also include the evaluation circuit for the acceleration sensor element, such as C/U, sigma-delta or AD converter, amplifier stages, offset compensation or controllers. The micromechanical component and the ASIC may be packaged in one housing. The exemplary embodiments and/or exemplary methods of the present invention semiconductor layer on the substrate and subdividing the substrate into the at least one chip with the at least one freely oscillatory mass and the at least one resonating structure. The production method may thus be carried out in a simple manner at little cost.

In one advantageous embodiment of the production method, the plurality of freely oscillatory masses and/or the plurality of resonating structure are formed using at least one thin-layer capping process. The size of the masses/structures formed may thus be reduced in an inexpensive manner.

Further features and advantages of the exemplary embodiments and/or exemplary methods of the present invention will be explained hereinafter with reference to the Figures.

BRIEF DESCRIPTION OF THE DRAWINGS

FIG. 4Ab shows illustrations of cross-sections through a substrate to illustrate a first embodiment of the production method.
FIG. 4Bb shows other illustrations of cross-sections through a substrate to illustrate a first embodiment of the production method.

DETAILED DESCRIPTION

Figure 1:
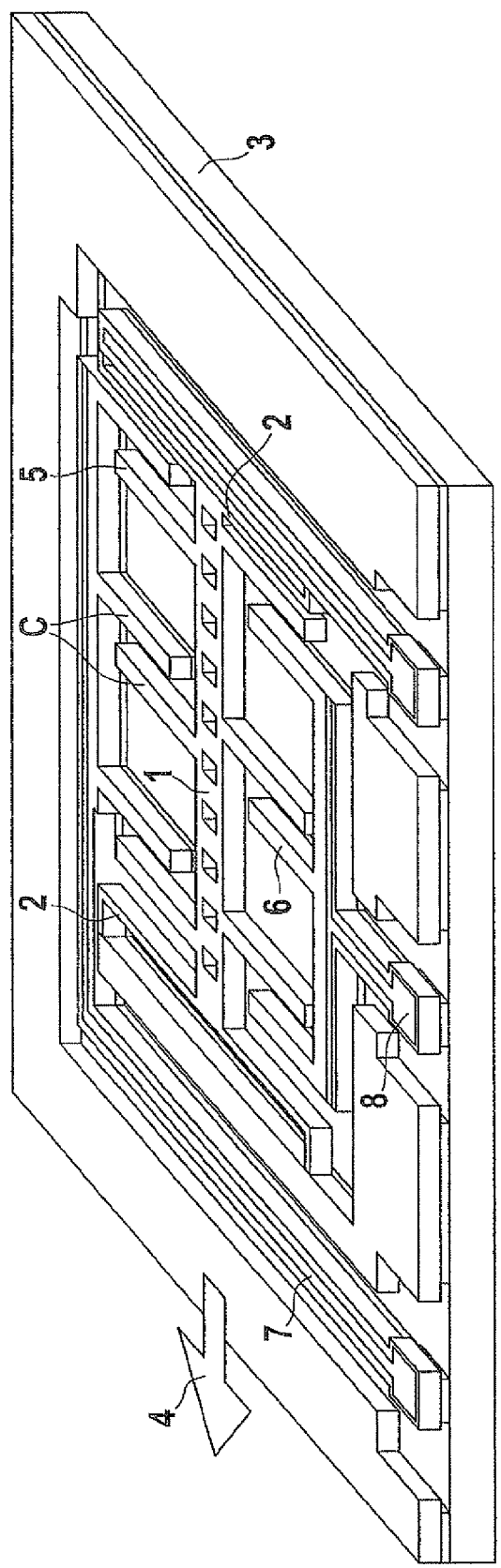
FIG. 1 shows an example of an acceleration sensor.

FIG. 1 shows an example of an acceleration sensor.

The acceleration sensor shown is formed using silicon technology and has a seismic mass 1 which is connected via at least one spring 2 to a chip 3 on which the acceleration sensor is disposed. The at least one spring 2 is constructed in such a manner that seismic mass 1 is displaceable, on acceleration of the acceleration sensor, in a detection direction 4 from a home position into at least one end position along detection direction 4. For example, seismic mass 1 is connected to chip 3 by two springs 2.

Electrodes 5 are fixed to both side faces of seismic mass 1. The longitudinal directions of electrodes 5 are perpendicular to the longitudinal direction of seismic mass 1. Adjacent to electrodes 5, counter-electrodes 6 are fixed to chip 3. Electrodes 5 and counter-electrodes 6 form a capacitor C. Movement of seismic mass 1 from the home position thus causes a change in the distances between electrodes 5 and associated counter-electrodes 6 and accordingly a change in capacitance C. Using contact lines 7, the change in capacitance C may be interrogated and then forwarded as a sensor signal.

The acceleration sensor illustrated in FIG. 1 may have a seismic mass 1, at least one spring 2, electrodes 5 and counter-electrodes 6 that are made of polysilicon. Before the polysilicon layer is applied for structuring of elements 1, 2, 5 and 6, a sacrificial layer, which may be made of silicon oxide, is applied to the regions of chip 3 on which the future freely oscillatory structures 1, 2 and 5 are formed. After structures 1, 2, 5 and 6 have been structured out of the polysilicon layer, the sacrificial layer may be at least partially removed under freely oscillatory structures 1, 2 and 5. That ensures good mobility of freely oscillatory structures 1, 2 and 5.

The acceleration sensor may have a cap with which freely oscillatory structures 1, 2 and 5 are hermetically sealed off from a spatial environment of the acceleration sensor. For example, the cap (not shown) is fixedly bonded to bond pads 8.

Figure 2:
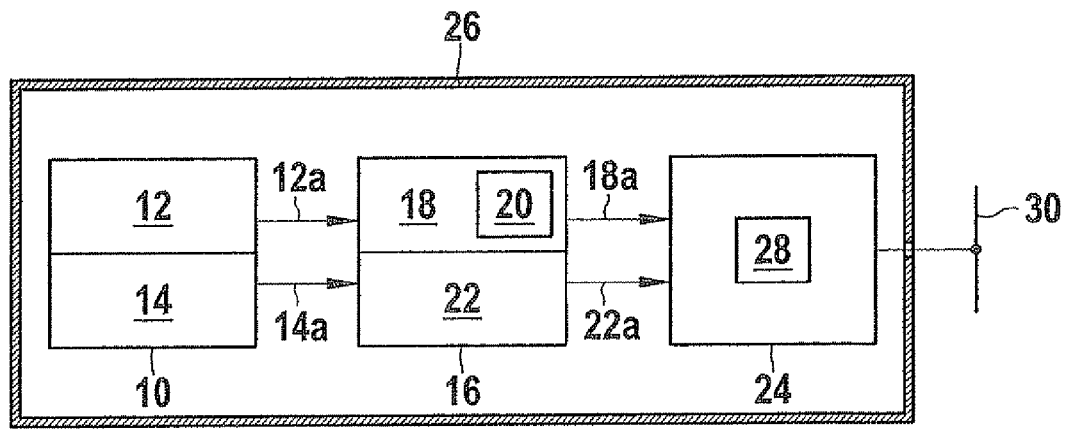
FIG. 2 is a schematic illustration of a first embodiment of the component.

FIG. 2 is a schematic illustration of a first embodiment of the component.

The component illustrated schematically has a first chip 10 in which a (micromechanical) resonator 12 and a (micromechanical) acceleration sensor 14 are integrated. Integration of resonator 12 and acceleration sensor 14 in first chip 10 is to be understood as meaning that at least one resonating structure of resonator 12 and at least one freely oscillatory mass of acceleration sensor 14 are disposed on a top surface of first chip 10 and/or in first chip 10. It will be appreciated that further elements of resonator 12 and/or of acceleration sensor 14 may be integrated in first chip 10. An ASIC (Application Specific Integrated Circuit) is also integrated into the component.

The resonator is a silicon resonator. A possible production method for forming an especially advantageous silicon resonator will be described hereinafter.

Acceleration sensor 14 is also constructed using silicon technology. An example of a possible embodiment of acceleration sensor 14 has already been described with reference to FIG. 1. A further example of acceleration sensor 14 will be explained hereinafter with the aid of a production method.

First chip 10 may be a compact chip. Compactness of first chip 10 refers to the fact that first chip 10 may be subdivided into a first chip unit and a second chip unit only by breaking/sawing/milling of first chip 10. Compact first chip 10 accordingly has no subdivision with which it is possible to subdivide it without exerting a sufficient pressure to break/saw/mill chip 10. For example, compact chip 10 is separated from a substrate, on which a plurality of resonating structures and freely oscillatory masses are formed, by sawing and/or milling.

Resonator 12 equipped with the resonating structure provides at an output a signal 12a having a resonant frequency. Owing to manufacturing tolerances or changing temperature, the frequency of signal 12a may vary. Acceleration sensor 14 correspondingly provides at an output an acceleration signal 14a in respect of a change in capacitance which is dependent on an acceleration of the component. may be integrated in first chip 10. An ASIC (Application Specific Integrated Circuit) is also integrated into the component.

The resonator is a silicon resonator. A possible production method for forming an especially advantageous silicon resonator will be described hereinafter.

Acceleration sensor 14 is also constructed using silicon technology. An example of a possible embodiment of acceleration sensor 14 has already been described with reference to FIG. 1. A further example of acceleration sensor 14 will be explained hereinafter with the aid of a production method.

First chip 10 may be a compact chip. Compactness of first chip 10 refers to the fact that first chip 10 may be subdivided into a first chip unit and a second chip unit only by breaking/sawing/milling of first chip 10. Compact first chip 10 accordingly has no subdivision with which it is possible to subdivide it without exerting a sufficient pressure to break/saw/mill chip 10. For example, compact chip 10 is separated from a substrate, on which a plurality of resonating structures and freely oscillatory masses are formed, by sawing and/or milling.

Resonator 12 equipped with the resonating structure provides at an output a signal 12a having a resonant frequency. Owing to manufacturing tolerances or changing temperature, the frequency of signal 12a may vary. Acceleration sensor 14 correspondingly provides at an output an acceleration signal 14a in respect of a change in capacitance which is dependent on an acceleration of the component.

A second chip 16 is disposed in the component. Signals 12a and 14a are forwarded from first chip 10 to second chip 16. Formed on second chip 16 are a first fractional PLL circuit 18, a temperature compensator 20 and an acceleration evaluating unit 22. Using first fractional PLL circuit 18 and temperature compensator 20 it is possible to stabilize the resonant frequency of signal 12a. A clock signal 18a having the stabilized resonant frequency is emitted at an output of first fractional PLL circuit 18. Acceleration evaluating unit 22 is configured to further process acceleration signal 14a. For example, acceleration evaluating unit 22 converts acceleration signal 14a into a voltage signal 22a that is dependent on the acceleration of the component. Where appropriate, acceleration signal 14a is pre-amplified at the same time. Instead of providing an analog signal 22a, acceleration evaluating unit 22 may also provide a digital acceleration signal at a signal output.

The two chips 10 and 16[1] are integrated together with a third chip 23 having a transmitter 24 into a housing 26, illustrated schematically, of the component. Second chip 16 is coupled to third chip 23 having transmitter 24 in such a manner that clock signal 18a and voltage signal 22a may be forwarded to transmitter 24.

[1] Translator's note: "14" in the German is assumed to be an error for "16".

Transmitter 24 is configured, for example, to transmit data determined by a sensor unit (not shown) in respect of a pressure in an external environment of the component to an external evaluating device. For that purpose transmitter 24 has a second fractional PLL circuit 28 which, using clock signal 18a provided, generates a transmission signal with information in respect of the data determined. The transmission signal generated by PLL circuit 28 is then output to a transmitting unit 30. Transmitting unit 30 thereupon sends the transmission signal with the data determined to the external evaluating device. In that manner it is possible to communicate, for example, data in respect of a pressure in a tire to an evaluating device outside of the tire.

Where appropriate, transmitter 24 may include a μC unit for further processing of voltage signal 22a provided. Transmitter 24 is configured to specify a frequency of measurement and transmission for determining pressure data and/or for outputting the determined data via transmitting unit 30 in dependence on the voltage signal 22a provided. That ensures, for example, that the frequency of measurement and transmission is greater when movement of the component is detected than when the component is stationary.

With phase-locked loops (PLL), which may also be referred to as phase-coupled closed-loop control circuits, a distinction is typically made between devices with fixed divider ratios (for example 32) and devices with precisely controllable divider ratios. The latter are generally referred to as fractional PLL circuits 18 and 28. Since the structure and mode of operation of the two fractional PLL circuits 18 and 28 is known from the related art, this will not be detailed here. Using a fractional PLL circuit 18 and 28, simple FSK (Frequency Shift Keying) modulation is possible. In the case of a fixed divider, FSK modulation has to be carried out by detuning resonator 12. In most cases, detuning of resonator 12 is carried out by connecting an additional capacitor. That additional effort and expenditure is not necessary in the case of a fractional PLL circuit 18 and 28. It is pointed out, however, that a similar embodiment of the component may also be implemented using at least one phase-locked loop with a fixed divider ratio.

Figure 3:
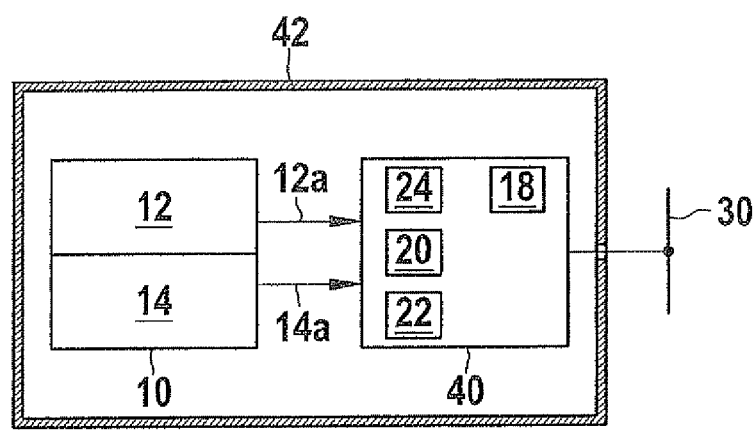
FIG. 3 is a schematic illustration of a second embodiment of the component.

FIG. 3 is a schematic illustration of a second embodiment of the component.

The component illustrated schematically in FIG. 3 has the already described first chip 10 with integrated resonator 12 and integrated acceleration sensor 14. At least one resonating structure of resonator 12 and at least one freely oscillatory mass of acceleration sensor 14 are therefore disposed on a top surface of first chip 10 and/or in first chip 10.

In contrast to the embodiment described above, first chip 10 is disposed in housing 42 together with a second chip 40 on which not only fractional PLL circuit 18, temperature compensator 20 and acceleration evaluating unit 22 but also transmitter 24 are disposed. PLL and VCO for resonator 12 and transmitter 24 are used together in this embodiment. Second chip 40 may be a compact chip and therefore has no subdivision with which it may be subdivided without a sufficient pressure for breaking/sawing/milling second chip 40 into two separate chip units. Transmitting unit 30 already described above is coupled to second chip 40.

The mode of operation of schematically illustrated elements 12, 14, 24, 18, 20, 22 and 30 of the component has already been described in the foregoing embodiment. It will not, therefore, be detailed here.

By virtue of the integration of elements 18, 20, 22 and 24 already described above into second chip 40, it is possible to make housing 42 smaller. Instead of three chips for providing elements 12, 14, 18, 20, 22 and 24, only the two chips 10 and 40 have to be integrated in housing 42 for the same elements 12, 14, 18, 20, 22 and 24. In particular, in that manner fractional PLL circuit 18 may also be used by transmitter 24. That obviates the need for a second fractional PLL circuit.

In a third embodiment, the micromechanical component, the ASIC and the transmitter may be implemented on one chip. For that purpose it is possible to use, for example, a so-called MEMS First process, in which first the MEMS (Micro-Electro-Mechanical-System) structures are fabricated and thereafter the electrical circuit is applied.

Figure 4A:
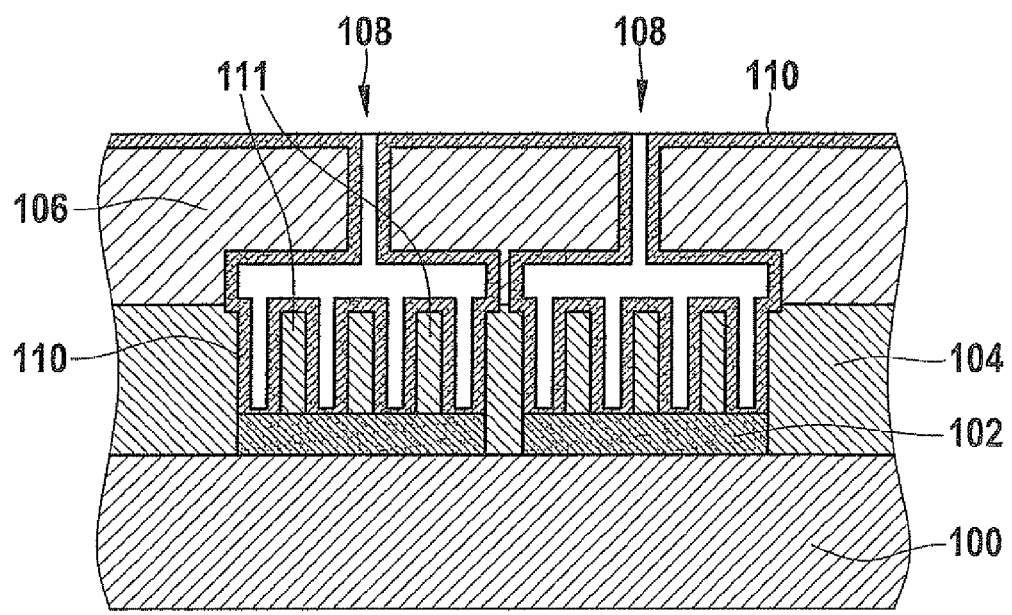
FIG. 4Aa shows schematic cross-sections through a substrate to illustrate a first embodiment of the production method.

FIGS. 4A and B show cross-sections through a substrate to illustrate an embodiment of the production method, FIGS. 4Aa and Ba showing schematic cross-sections and FIGS. 4Ab and Bb showing illustrations of cross-sections.

The production of an acceleration sensor using a thin-layer capping process will be explained with reference to FIGS. 4A and 4B. It is pointed out, however, that it is also possible for a silicon resonator having a resonating silicon structure to be formed using an analogous thin-layer capping process. Since a production method for forming the silicon resonator using a thin-layer capping process will be obvious to a person skilled in the art by reference to FIGS. 4A and 4B, that production method will not be described in addition here.

FIG. 4Aa shows a cross-section through a substrate 100.

Substrate 100 is made, for example, of silicon. A top surface of substrate 100 is at least partially covered by a buried layer 102. In particular, the regions of substrate 100 that lie underneath the freely oscillatory structures of the acceleration sensor which are later formed are covered by buried layer 102. Buried layer 102 may be made, for example, of silicon oxide. Since methods for applying and structuring buried layer 102 are known from the related art, they will not be detailed here.

In a further step of the method, a semiconductor layer 104 is applied to buried layer 102 and the non-covered areas of the top surface of substrate 100. For example, semiconductor layer 104 includes polysilicon. A first mask 106 is then applied to semiconductor layer 104.

Using a conventional etching process, etching through-holes 108 may be etched into first mask 106. Etching of etching holes 108, which may also be referred to as ventilation holes, may be done using chlorine trifluoride ($ClF_3$). Etching holes 108 are situated at least partially above at least one region of semiconductor layer 104 out of which the freely oscillatory structures of acceleration sensor 111 are structured in a subsequent step of the method (see FIG. 4Ba).

FIG. 4Aa shows the result of thermal oxidation which is performed subsequently. By thermal oxidation it is possible to remove etching damage to the wall structures formed. The oxide layer 110 so formed may be removed in a subsequent etching step together with at least regions of the buried layer 102, serving as a sacrificial layer, by a standard etching step. Removal of regions of buried layer 102 ensures an advantageous mobility of freely oscillatory structures 111 of the acceleration sensor.

Using a second mask 112 applied to first mask 106, etching holes 108 may be sealed in a further step of the method. Ventilation holes 108 may thereby be hermetically sealed (see FIG. 4Ba). Second mask 112 is, for example, an epitaxial silicon layer.

It is thus possible for freely oscillatory structures 111 of the acceleration sensor to be hermetically sealed off using second mask 112 while at same time dispensing with a capping process over a large surface area. This makes it possible to produce distinctly smaller acceleration sensors.

Figure 4B:
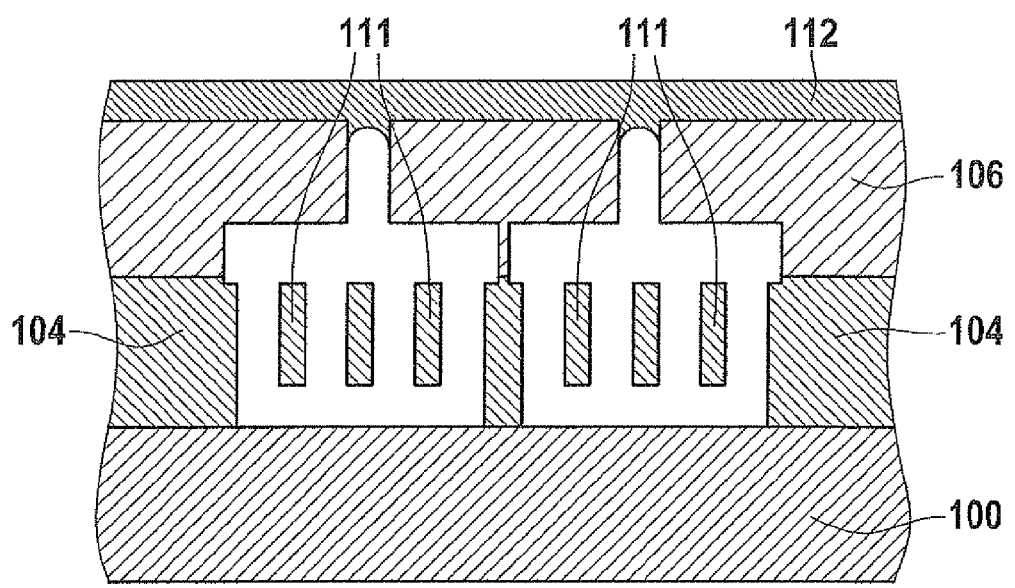
FIG. 4Ba shows other schematic cross-sections through a substrate to illustrate a first embodiment of the production method.
Figure 4A:
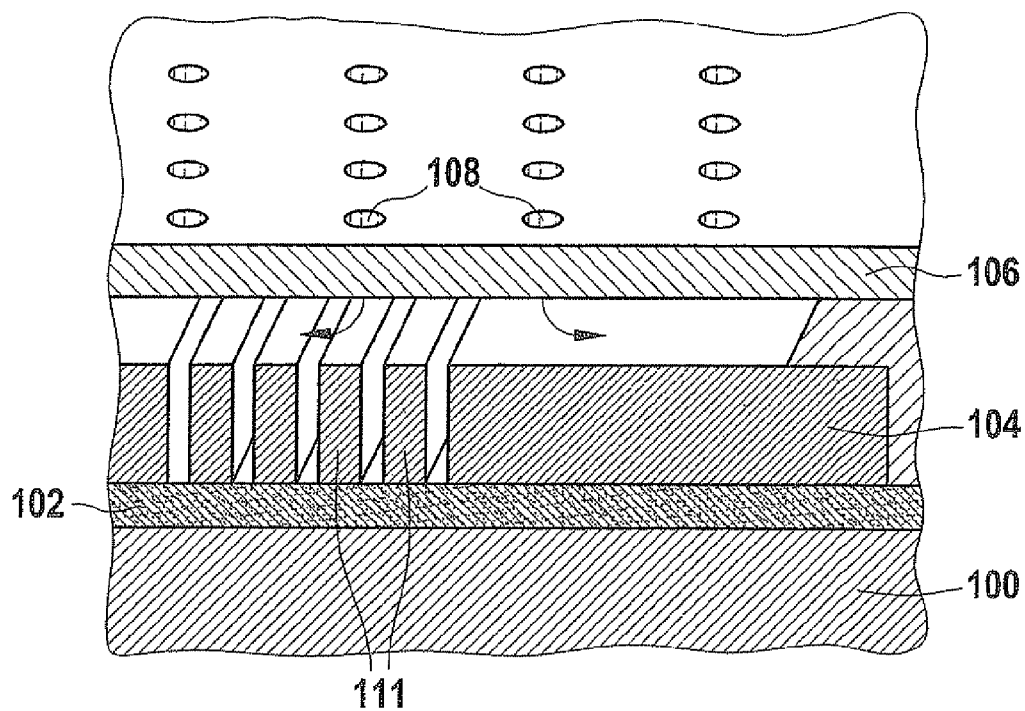
Figure 4B:
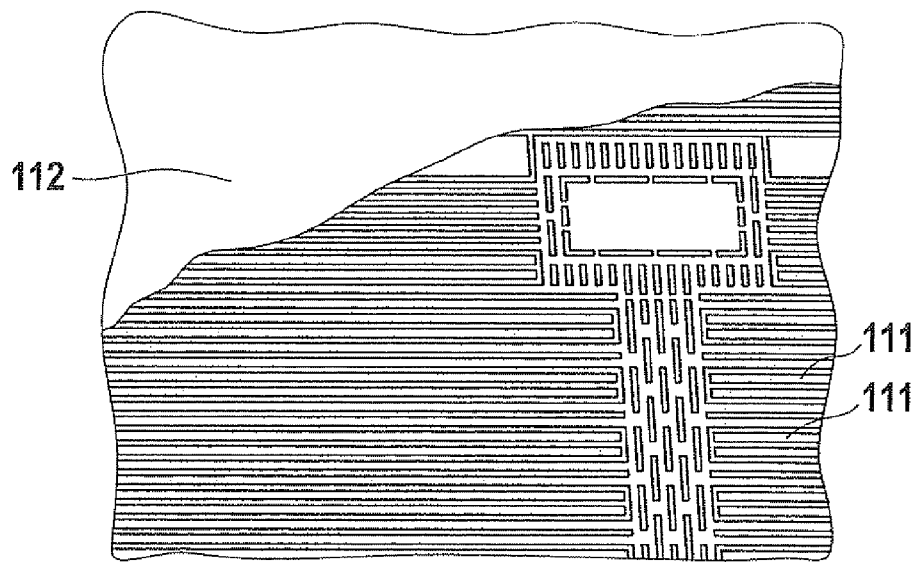

FIG. 4Bb is a plan view of the freely oscillatory structures of the acceleration sensor following partial removal of second mask 112.

Figure 5:
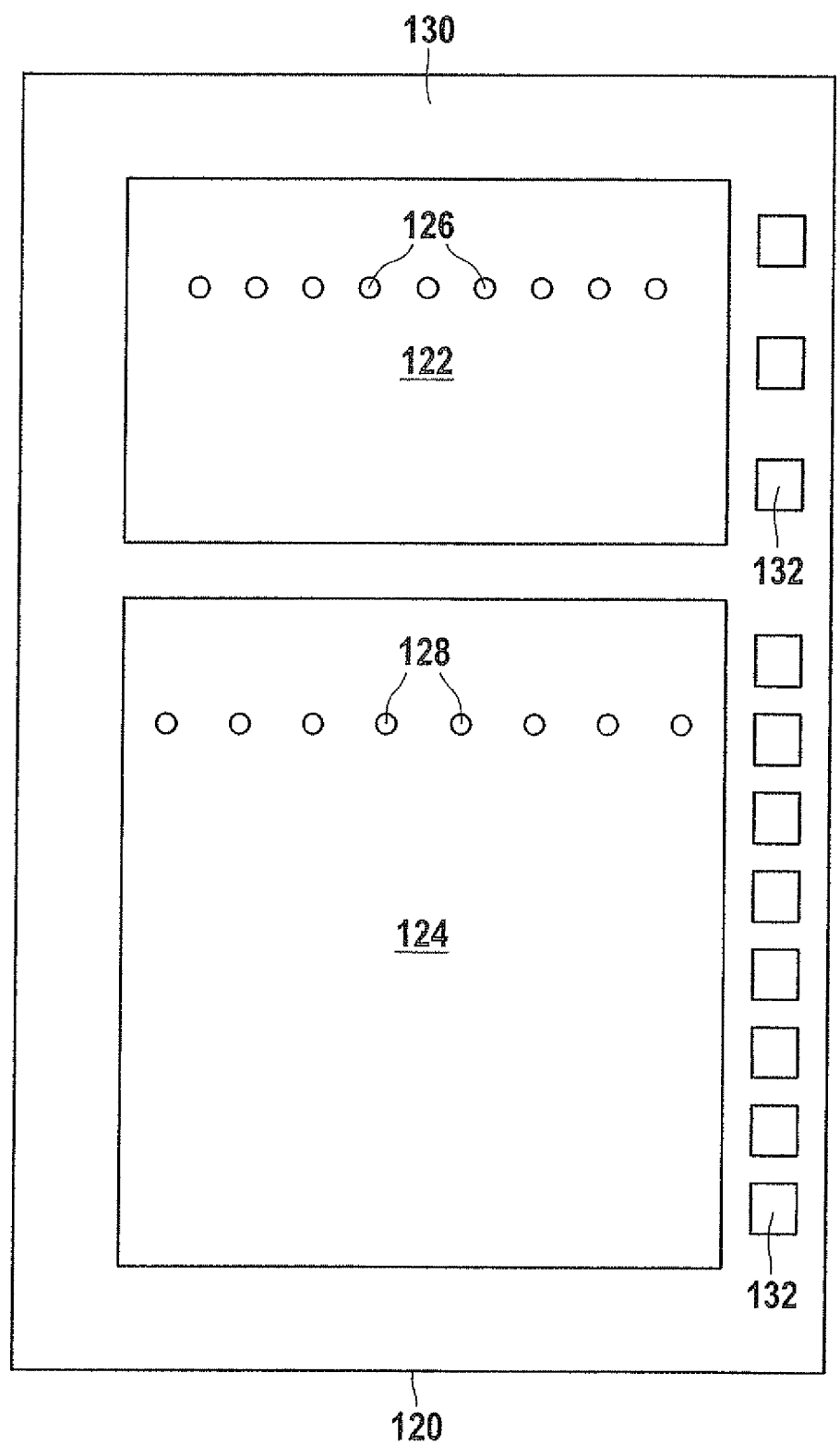
FIG. 5 is a plan view of a micromechanical resonator and an acceleration sensor to illustrate a second embodiment of the production method.

FIG. 5 is a plan view of a micromechanical resonator and an acceleration sensor to illustrate a second embodiment of the production method.

A plan view is shown of a chip 120 in which a silicon resonator and an acceleration sensor are integrated. Integration of the silicon resonator and acceleration sensor in chip 120 is to be understood as meaning that at least one resonating structure of the resonator is formed in a first region 122 and at least one freely oscillatory mass of the acceleration sensor is formed in a second region 124 of chip 120. It is, of course, possible for further elements of the silicon resonator and the acceleration sensor to be disposed in and/or on chip 120. Since the production of those further elements of the silicon resonator and the acceleration sensor is obvious to a person skilled in the art, it will not be detailed here.

The top surface of chip 120 is shown in FIG. 5 before etching holes 126 and 128 are sealed. By way of etching holes 126, a first internal volume, etched into region 122 and adjacent to the at least one resonating structure of the silicon resonator, is connected to an external environment of chip 120. Correspondingly, etching holes 128 connect a second internal volume, etched into region 124 and adjacent to the at least one freely oscillatory mass of the acceleration sensor, to an external environment of chip 120.

The silicon resonator and the acceleration sensor are surrounded by a bonding frame 130 or a frame for a wafer-level cap. Disposed on bonding frame 130 are bond pads 132. Since the function of bonding frame 130 and bond pads 132 are familiar to a person skilled in the art, it will not be detailed here.

Integration of the silicon resonator and the acceleration sensor into chip 120 is accomplished, for example, using the method steps described with reference to FIGS. 4A and B. In that method, a plurality of layers including at least one semiconductor layer and a first mask are applied to a substrate. Then, etching through-holes 126 and 128 are etched and the at least one resonating silicon structure of the resonator is structured out of region 122 and the at least one freely oscillatory structure of the acceleration sensor is structured out of region 124.

Especially advantageous method steps for sealing etching holes 126 and 128 will be described below:

In the case of a component with a silicon resonator and an acceleration sensor, other values with regard to Q-factor, resonant frequency and/or spring constant of the silicon resonator may generally be preferred than for Q-factor, resonant frequency and/or spring constant of the acceleration sensor. In most cases, it is advantageous for the silicon resonator to have a high Q-factor and/or a high resonant frequency. For that reason, despite its small size the at least one resonating structure of the silicon resonator may be configured to be relatively stiff/fixed. By contrast, it is often desirable for the acceleration sensor to have a low Q-factor and/or a low resonant frequency. It may therefore be advantageous if, despite its comparatively large size, the at least one freely oscillatory mass of the acceleration sensor is easily displaceable/non-rigid and thus has a low bending resistance.

The Q-factor of micromechanical oscillating systems with oscillatory masses is determined by dissipation mechanisms. A fundamental dissipation mechanism in the case of a micromechanical oscillating system is gas damping. Gas damping occurs through the interaction (collisions) of the molecules in a volume of gas at least partially surrounding the at least one oscillatory mass. A high gas density results in a high degree of damping and thus to a low mechanical Q-factor. Correspondingly, a high mechanical Q-factor may be set by way of a low gas density.

The desired Q-factor and/or resonant frequency of the silicon resonator may be set by setting a first ambient pressure in the environment of chip 120. While the first ambient pressure is kept almost constant, etching holes 126 are hermetically sealed with the result that a first internal pressure corresponding to the first ambient pressure is set in the first internal volume (of the silicon resonator). Etching holes 126 may be sealed in such a manner that the desired first internal pressure may be maintained for a prolonged period.

Thereafter, a second ambient pressure differing from the first ambient pressure is set in the environment of chip 120. For example, chip 120 is for that purpose taken out of a first pressure chamber with the first ambient pressure to a second pressure chamber with the second ambient pressure. While the second ambient pressure is kept almost constant, air holes 128 are hermetically sealed. In the second internal volume (of the acceleration sensor), therefore, a second internal pressure equal to the second ambient pressure is present for a prolonged period.

When chip 120 is later in operation, therefore, the pressure in the first internal volume with the at least one resonating structure of the silicon resonator is the first internal pressure and the pressure in the second internal volume with the at least one freely oscillatory structure of the acceleration sensor is the second internal pressure which differs from the first internal pressure. For example, the first internal pressure is distinctly lower than the second internal pressure. The comparatively low first internal pressure ensures a low degree of mechanical damping and thus a low degree of energy dissipation for the silicon resonator. Owing to the comparatively low first internal pressure, therefore, the silicon resonator is well suited to timing applications.

Since a really low mechanical resonance magnification and a low Q-factor are generally desirable for the acceleration sensor in order to ensure a flat signal transmission function and good interference suppression, the second internal pressure, which is markedly higher than the first internal pressure, improves the functional capability of the acceleration sensor considerably.

The modification of the thin-layer capping process described with reference to FIG. 5, involving a multi-stage sealing mechanism, for example a first vacuum sealing process and a second sealing process at a higher ambient pressure, thus improves the functional capability of the sensors disposed on chip 120.

In one exemplary embodiment, the first internal pressure is less than 50 mbar whereas the second internal pressure is greater than 50 mbar. In particular, the pressure in the first internal volume may be a first internal pressure in the range of μbar or less.

In order, in addition, to prevent the at least one non-rigid and freely oscillatory structure of the acceleration sensor from becoming attached to a surrounding wall on experiencing excessive displacement, internal surfaces of the acceleration sensor may be covered with an anti-stiction coating of the kind described, for example, in U.S. Pat. No. 6,930,362 B2. In that manner, sticking of the at least one freely oscillatory structure of the acceleration sensor may be prevented well.

In a development of chip 120, at least two acceleration sensors may be integrated into chip 120. Accordingly, using the two acceleration sensors of chip 120 it is possible to detect direction of movement/direction of rotation in addition to detecting movement. For example, a component configured as a wheel pressure sensor also detects in that case a direction of rotation of the wheel.

A component according to the exemplary embodiments and/or exemplary methods of the present invention configured as a tire pressure sensor need not be disposed not only on the rim of a wheel. As an alternative or in addition, the component may also be disposed on the tire itself. A tire pressure sensor disposed in such a manner may, for example, also determine loading of the vehicle and/or tire tread depth by measuring in the tangential or radial direction.

The exemplary embodiments and/or exemplary methods of the present invention has been described in the foregoing paragraphs with reference to components configured as pressure sensor devices which are used especially as wheel pressure sensors. It is pointed out, however, that the present invention is not limited to those examples, but may also be applied instead to a component that is not configured as a pressure sensor device.

What is claimed is:

1. A component, comprising:
   an acceleration sensor having at least one freely oscillatory mass; and
   a resonator having at least one resonating structure;
   wherein the at least one freely oscillatory mass of the acceleration sensor and the at least one resonating structure of the resonator are disposed at least one of on and in one chip.

2. The component of claim 1, wherein at least one of the at least one freely oscillatory mass of the acceleration sensor and the at least one resonating structure of the resonator are formed from a semiconductor material.

3. The component of claim 1, wherein the at least one freely oscillatory mass of the acceleration sensor projects at least partially into a first internal volume having a first internal pressure, and the at least one resonating structure of the resonator projects at least partially into a second internal volume having a second internal pressure, which is different from the first internal pressure.

4. The component of claim 1, wherein the component includes a phase-locked loop with a voltage-controlled oscillator, which is coupled to the resonator so that a reference signal having a reference frequency provided by the resonator may be provided to the phase-locked loop.

5. The component of claim 4, further comprising:
   a transmitter chip configured to generate a transmission signal by way of the phase-locked loop, the voltage-controlled oscillator and the reference signal having the reference frequency provided by the resonator.

6. The component of claim 1, further comprising:
   a pressure sensor device configured to ascertain information in respect of a pressure in an external volume of the component and to provide a corresponding information signal.

7. The component of claim 6, wherein the component is a tire pressure sensor.

8. A method for producing a component, the method comprising:
   forming an acceleration sensor having at least one freely oscillatory mass; and
   forming a resonator having at least one resonating structure;
   wherein the at least one freely oscillatory mass of the acceleration sensor and the at least one resonating structure of the resonator are formed at least one of on and in one chip.

9. The method of claim 8, further comprising:
   structuring a plurality of freely oscillatory masses out of a semiconductor layer on a substrate;
   structuring a plurality of resonating structures out of the semiconductor layer on the substrate;
   subdividing the substrate into the at least one chip with the at least one freely oscillatory mass and with the at least one resonating structure.

10. The production method of claim 9, wherein at least one of the plurality of freely oscillatory masses and the plurality of resonating structures are formed using at least one thin-layer capping process.

* * * * *